US008199580B2

(12) United States Patent
Leburton et al.

(10) Patent No.: US 8,199,580 B2
(45) Date of Patent: Jun. 12, 2012

(54) MEMORY DEVICE THAT SELECTIVELY STORES HOLES

(75) Inventors: Jean-Pierre Leburton, Urbana, IL (US); Jeanlex Soares De Sousa, Fortaleza (BR); Gil De Aquino Farias, Fortaleza (BR); Valder Nogueira Freire, Fortaleza (BR)

(73) Assignee: The Board of Trustees of the University of Illinois, Urbana, IL (US)

( * ) Notice: Subject to any disclaimer, the term of this patent is extended or adjusted under 35 U.S.C. 154(b) by 392 days.

(21) Appl. No.: 12/391,651

(22) Filed: Feb. 24, 2009

(65) Prior Publication Data

US 2009/0213662 A1 Aug. 27, 2009

Related U.S. Application Data

(60) Provisional application No. 61/031,171, filed on Feb. 25, 2008.

(51) Int. Cl.
*G11C 11/34* (2006.01)
(52) U.S. Cl. ............. 365/185.18; 365/185.29; 977/773; 977/954
(58) Field of Classification Search ............ 365/185.29, 365/185.18, 129, 151; 977/700, 973, 954
See application file for complete search history.

(56) References Cited

U.S. PATENT DOCUMENTS

| | | | |
|---|---|---|---|
| 2007/0064468 A1* | 3/2007 | Seol et al. | 365/129 |
| 2007/0224751 A1* | 9/2007 | Roizin et al. | 438/199 |
| 2008/0230900 A1* | 9/2008 | Porter et al. | 257/737 |

OTHER PUBLICATIONS

Rana et al., "Kinetic Modelling of Electron Tunneling Processes in Quantum Dots Coupled to Field-Effect Transistors", Superlattices and Microstructures, vol. 23, No. 3/4, 1998; Academic Press Limited; pp. 757-770.
Sousa et al., "Three-Dimensional Self-Consistent Simulation of the Charging Time Response in Silicon Nanocrystal Flash Memories", Journal of Applied Physics, vol. 92, No. 10, Nov. 15, 2002; American Institute of Physics; pp. 6182-6187.
Sousa et al., "Effects of Crystallographic Orientations on the Charging Time in Silicon Nanocrystal Flash Memories", Applied Physics Letters, vol. 82, No. 16, Apr. 21, 2003; American Institute of Physics; pp. 2685-2687.
Freire et al., "The Impact of High-k Dielectrics in Nanocrystal Flash Memories", Proceedings of SPIE, vol. 5732, Quantum Sensing and Nanophotonic Devices II, edited by Manijeh Razeghi, Gail J. Brown. Invited Paper. pp. 547-555.
Sousa et al., "Hole-Versus Electron-Based Operations in SiGe Nanocrystal Nonvolatile Memories", Applied Physics Letters, vol. 90, 223504 (2007); American Institute of Physics; pp. 223504-1 to 223504-3.
Reboredo et al., "Dark Excitons due to Direct Coulomb Interactions in Silicon Quantum Dots", Physical Review B, vol. 61, No. 19, May 15, 2000-I; The American Physical Society; pp. 13073-13087.

(Continued)

*Primary Examiner* — Alexander Sofocleous
*Assistant Examiner* — Hien Nguyen
(74) *Attorney, Agent, or Firm* — Guntin Meles & Gust, PLC; Ed Guntin

(57) ABSTRACT

A system that incorporates teachings of the present disclosure may include, for example, a memory device having a memory cell to selectively store holes by photon and bias voltage induction as a representation of binary values.

16 Claims, 4 Drawing Sheets

OTHER PUBLICATIONS

Hill et al., "Size Dependence of Excitons in Silicon Nanocrystal", Physical Review Letters, vol. 75, No. 6, Aug. 7, 1995; The American Physical Society; pp. 1130-1133 +2 Figures.

Delerue et al., "Multiexponential Photoluminescence Decay in Indirect-Gap Semiconductor Nanocrystals", Physical Review B, 73, 235318 (2006); The American Physical Society; pp. 235318-1 to 235318-4.

Walters et al., "Silicon Optical Nanocrystal Memory", Applied Physics Letters, vol. 85, No. 13, Sep. 27, 2004; American Institute of Physics; pp. 2622-2624.

Bennett et al., "Single-Photon-Emitting Diodes: a Review", Wiley-VCH Verlag GmbH & Co., KGaA, Weinheim, 2006; phys. stat. sol. (b) 243, No. 14, pp. 3730-3740.

Kako et al., "A Gallium Nitride Single-Photon Source Operating at 200 K", Nature Materials, vol. 5, Nov. 2006; Nature Publishing Group; pp. 887-892.

Strauf et al., "Quantum Optical Studies on Individual Acceptor Bound Excitons in a Semiconductor", Physical Review Letters, vol. 89, No. 17, Oct. 21, 2002; The American Physical Society; pp. 177403-1 to 177403-4.

* cited by examiner

MEMORY DEVICE THAT SELECTIVELY STORES HOLES

PRIOR APPLICATION

The present application claims the benefit of priority to U.S. Provisional Application No. 61/031,171 filed on Feb. 25, 2008, by Leburton et al., entitled, "Memory Device," which is hereby incorporated herein by reference.

STATEMENT AS TO FEDERALLY SPONSORED RESEARCH

This invention was made with government support under National Science Foundation awarded under Grant No. DMR-03 25939 ITR. The government has certain rights in this invention.

FIELD OF THE DISCLOSURE

The present disclosure relates generally to memory devices, and more specifically to a memory device that selectively stores holes.

BACKGROUND

Data operation in nanocrystal (NC) flash memories can be achieved by controlling charge transfer between NCs embedded within the gate oxide and the channel of a metal-oxide-semiconductor field-effect transistor (MOSFET) [1]. It is well known that during programming operations, the tunneling time of a single electron from the MOSFET channel into a NC is of the order of tens to hundreds of nanoseconds, depending on the tunneling oxide thickness. This time can be considered as a figure of merit of the overall device programming performances. On the other hand, the NC discharging time (erase operation) is a few order of magnitude faster. Ignoring phonon-assisted processes in the programming operation, electrons in the MOSFET channel can only tunnel into the NCs when their energies match (by means of the gate voltage) an allowed energy state in the NC.

In the erase operation, confined electrons tunnel from the NCs to the continuum density of states of the bulk substrate. Thus, the number of tunneling channels for charge erasing is much higher than for charge programming. Programming performance can be engineered by optimizing parameters such as NC shape and size, tunneling barrier thickness, and control oxide thickness[2-4]. However, the major limitation for extremely fast performances is the reduced NC density of states (DOS) in comparison with the two dimensional electron gas DOS in the MOSFET channel.

DETAILED DESCRIPTION

Figure 1:
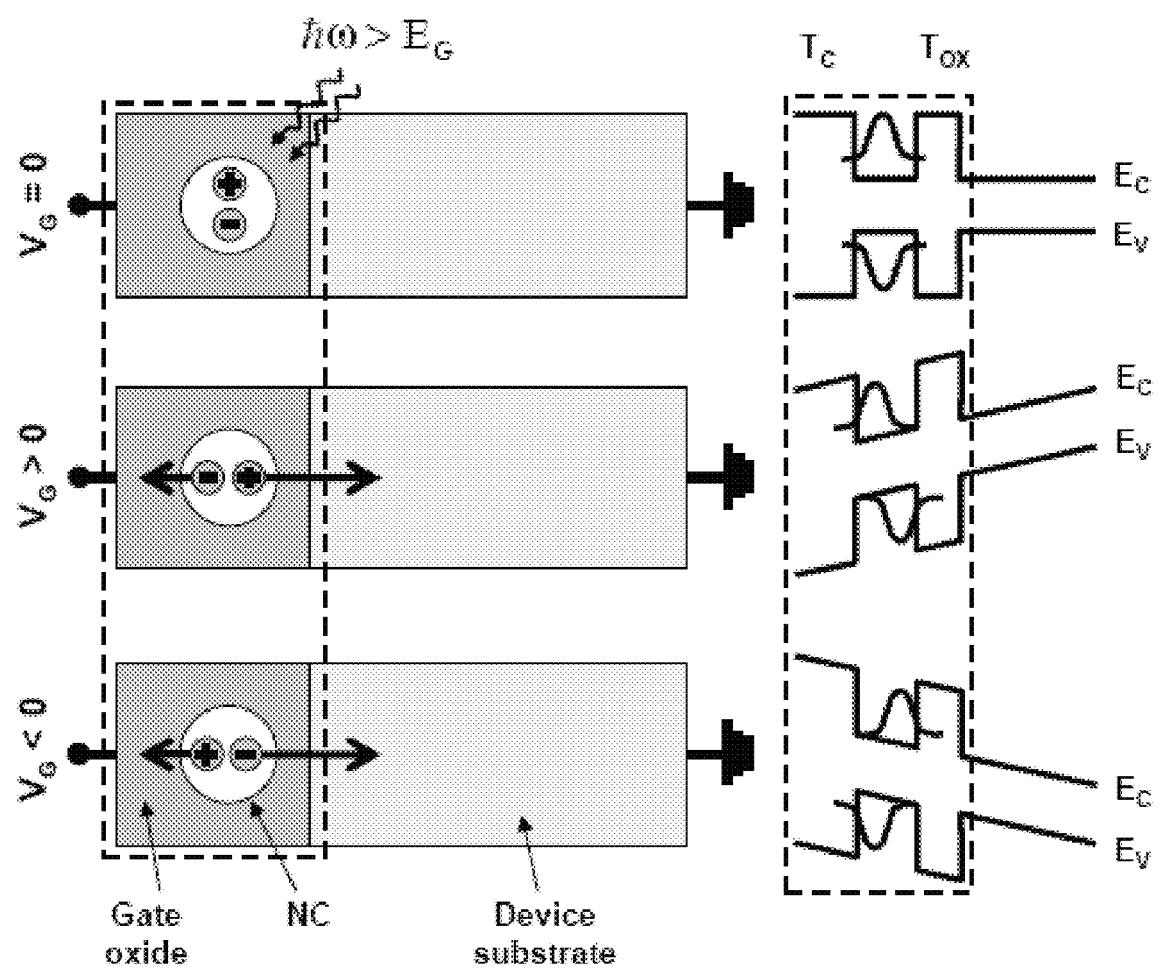
FIG. 1 depicts illustrative schematics of a light-induced programming of electrons ($V_G$>0) and holes ($V_G$>0) in nanocrystal flash memories, where $V_G$ represents the external gate voltage. The conduction and valence band profiles are detected for each case. The region enclosed by the dashed lines represents the device region investigated in this work. The control and tunneling oxide thicknesses are $T_C$=7 nm and $T_{OX}$=1.5 nm, respectively.

One embodiment of the present disclosure entails a memory device having an n-type doped silicon substrate, a tunnel oxide layer formed on the n-type doped silicon substrate, a floating nanocrystal gate embedded in a control oxide layer and formed on the tunnel oxide layer, a drain region formed by implantation of a p-type dopant material in the n-type silicon substrate, a source region formed by implantation of a p-type dopant material in the n-type silicon substrate, a photon source coupled to the floating nanocrystal gate, and a control gate formed on the control oxide layer. A first memory state can be produced by applying photons generated by the photon source to the floating nanocrystal gate to induce electron-hole pairs, and applying one or more bias voltages to at least one among the control gate, the drain region and the source region to induce a removal of electrons from the floating nanocrystal gate.

Another embodiment of the present disclosure entails a memory device having a memory cell to selectively store holes by photon and bias voltage induction as a representation of binary values.

Yet another embodiment of the present disclosure entails a memory device having an array of memory cells, each memory cell selectively stores holes by photon and bias voltage induction as a representation of binary values.

Another embodiment of the present disclosure entails an apparatus having a memory array to selectively store holes by photon and bias voltage induction, and a computing device coupled to the memory array.

Yet another embodiment of the present disclosure entails a method for selectively storing holes by photon and bias voltage induction in a device.

Another embodiment of the present disclosure entails a method for manufacturing an array of memory cells that selectively store holes by photon and bias voltage induction.

An embodiment of the present disclosure entails a method for offering for sale an array of memory cells that selectively store holes by photon and bias voltage induction.

Another embodiment of the present disclosure entails a laser having a photon emitter coupleable to a memory cell that selectively store holes by photon and bias voltage induction.

An embodiment of the present disclosure entails a light emitting diode having a photon emitter coupleable to a memory cell that selectively store holes by photon and bias voltage induction In the present disclosure, a light source emitting photons with energies around the NC band gap can be integrated in a memory cell, and the programming voltages can be synchronized with the optical pulses (see FIG. 1) that generate confined electron-hole pairs (excitons) in the NCs. Positive (negative) gate voltages (VG) attract electrons (holes) toward the gate contact while holes (electrons) are repelled away, tunneling to the continuum density of states (DOS) of the substrate, leaving the particle with opposite sign stored within the NC (target particle). In the present illustration, programming can be achieved optically, while all other memory operations (data retention, erase and readout) can be performed electrically as in conventional NC flash memories.

The foregoing two step programming takes full advantage of quick tunneling from confined to continuum states, which leads to programming times many orders of magnitude faster than voltage-induced programming. In that context, it bears similarity with the erase operation in actual NC flash memories: the only difference is the presence of a second particle with opposite sign, which interacts with the target particle via a Coulomb potential. In practice, excitonic complexes (biexcitons and trions) can be also generated, but due to their extremely small lifetimes, they rapidly decay to the single ground state exciton. The mandatory condition for achieving optical programming is that out tunneling of the escaping particle must be faster than the recombination lifetime of the confined exciton. Fortunately, due the indirect Si band gap, the exciton recombination lifetime in Si NCs is many orders of magnitude slower than the out-tunneling time of the escaping particle from the NC to the substrate.

The electronic states Ye and Yh of a single Si NC embedded in a oxide layer (SiO2 and HfO2) can be obtained by solving the following Hartree equations:

$$\left[-\frac{\hbar^2}{2}\nabla \frac{1}{M_i}\nabla + \Delta E_i(r) + q_i[\phi\text{ext}(r) + \phi_j(r)]\right]\Psi_i(r) = E_i\Psi_i(r) \quad (1)$$

where $q_i$, $M_i$, $\Delta E_i$, and $\phi_j$ (i,j=e,h) represent the particle charge, carrier effective masses, the confinement barriers, and Coulomb potential due to the particle with opposite sign, respectively. $\phi_{ext}(r)=-F\cdot r$ can represent an external electrostatic potential generated by VG. In the case of electrons, the present calculation fully includes the well known multivalley and effective mass anisotropy of the Si band structure [2]. The Coulomb potential phi_i can be obtained with the Poisson equations, $$\nabla\cdot[\in(r)\nabla\phi_j(r)]=-q_j|\Psi_j(r)|^2 \quad (2)$$

Equations (1) and (2) are then solved self-consistently for both electrons and holes until convergence. This approach has the advantage of capturing the dielectric mismatch effect on the particle wavefunctions and energy states. The programming time of electrons (holes) can be computed as the out-tunneling time of holes (electrons) which is obtained with the use of transmitting boundary conditions in the effective confinement potential of the escaping particle $\Delta E_i(r)+q_i[\phi_{ext}(r)+\phi_j(r)]$. The resulting open quantum system can exhibit quasi-bound states with finite lifetimes $\tau_i=\text{Im}(E_i)/2h$, where Ei is ground state energy [5]. As for the material parameters, the same values of Ref. 5 can be used.

The total exciton energy can be calculated as $E_T=E_e+E_h+E_G$, where $E_G$ is the bulk Si energy gap. The exciton binding energy can be computed as $E_B=(E_e^0+E_h^0)-(E_e+E_h)$, where $E_i^0$ represents the particle energy calculated without Coulomb interaction. Even though the present model does not include the contribution from the electron-hole exchange energy and complicated size-dependent screening effects [6], it is in d agreement with the atomistic calculations of Hill and Whaley for NC sizes varying between 3 and 7 nm [7]. In comparing size-dependent exciton results with the sophisticated model of Reboredo et al. [6], deviations between 0.1 and 0.2 eV have been found, which does not appreciably affect the out-tunneling times of the confined particles.

Figure 2:
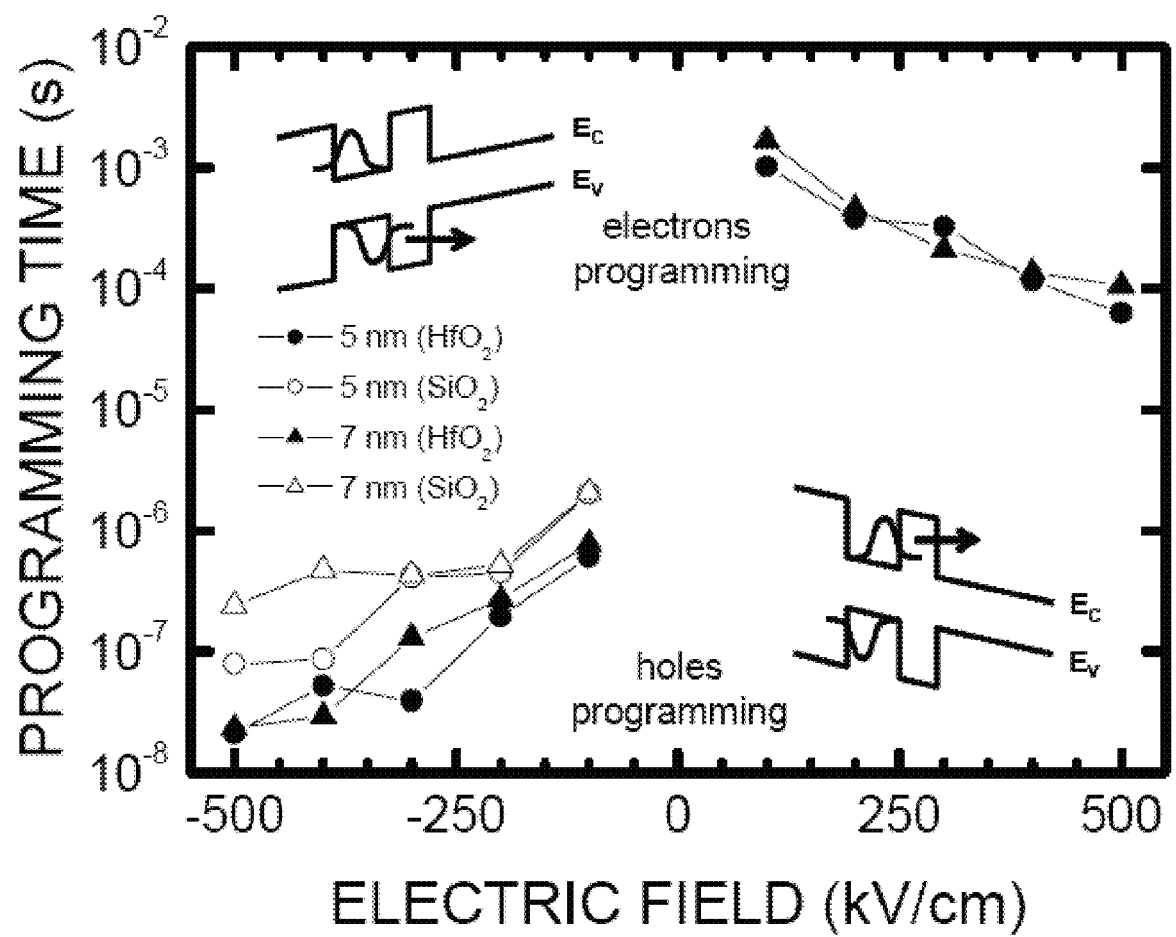
FIG. 2 depicts an illustrative comparison of the electric field dependence of the programming times of electrons and holes in hemispherical $S_i/S_iO_2$ and $S_i/HfO_2$ NC's of different sizes (D=5 nm and D=7 nm)

FIG. 2 displays the programming time of electrons (F>0) and holes (F<0) for hemispherical NCs. It is seen that the hole programming times are many orders of magnitude faster than those of electrons and that NC size has practically no effect on the programming performances. For both Si/SiO$_2$ and Si/HfO$_2$ systems, the confinement barrier for holes is larger than for electrons causing longer hole out-tunneling time (slow electron programming). In particular, the hole confinement in Si/SiO$_2$ NCs is so large that the electron programming times do not appear in the scale of FIG. 2. For this system, it is also observed that the Coulomb interaction strongly contributes to the extremely long electron programming times. In a recent work [5], the out-tunneling times of a single hole (electron) were calculated, i.e., without the presence of the electron (hole), in a hemispherical Si/HfO2-based NC device ($T_{ox}$=1.5 nm and D=7 nm) varying between $10^{-5}$ and $10^{-4}$ s ($10^{-8}$ and $10^{31\ 7}$ s). By comparing these values with those presented in FIG. 2, it is observed that the presence of the target particle slows down the out tunneling of holes (electrons) by approximately three (one) orders of magnitude.

The above results indicate that optical programming is almost as fast as the erase processes of conventional NC flash memories. However, there are two considerations for this mechanism to be efficient since it should be faster than (i) electron-hole recombination in the NC and (ii) conventional voltage-induced programming. For the former, recent atomistic calculations of the recombination rate $\tau_R$ in Si/SiO$_2$ including phonon-assisted processes show that the average recombination lifetime for the NC sizes investigated in this work is of the order of $10^{-3}$ s [8], as due to the indirect gap of Si, which hampers recombination. Even though data on the recombination lifetime in Si/HfO$_2$ NCs are not currently available, it can be assumed that $\tau_R$ in Si/HfO$_2$ and Si/SiO$_2$ NCs are of the same order of magnitude. In FIG. 2, it can be observed that $\tau_R$ in Si/HfO$_2$ NCs only competes with electron programming, which can be remedied by either increasing the external field F strength or decreasing $T_{ox}$.

It is also apparent that even though field-dependent studies of the recombination processes in Si NCs are very limited, a further increase of $\tau_R$ with F is expected because of the reduction in the electron-hole wavefunctions overlap. Therefore, in a first approximation, any competition between carrier recombination and optical programming can be ruled out. As for the second requirement, Table 1 presents a comparison between the optical and voltage-induced characteristic programming times. Positive (negative) quantities represent the electron (hole) programming. A straight comparison between both mechanisms for F<=500 kV/cm (same range of FIG. 2) shows that hole optical programming is already three orders of magnitude faster than voltage-induced programming.

On the other hand, optical programming for electrons is much slower than for holes. Thus, optical programming is only suitable for holes. However, one notices that the F range displayed in FIG. 2 are for voltages below threshold ($V_{th}\approx\pm3$ V under flatband conditions), and that $\tau_v$ tends to saturate for $V_G$ approx $V_{th}$ [2]. As shown in Table 1, the condition $V_G=V_{th}$ corresponds to $E_F$=1600 kV/cm, for which $\tau_O<<\tau_V$ thereby satisfying the second requirement. Moreover, $\tau_O$ does not saturate for $V_G>V_{th}$. Thus, it can be shown that optical programming leads to much faster device performances in comparison with conventional voltage-induced programming.

Figure 3:
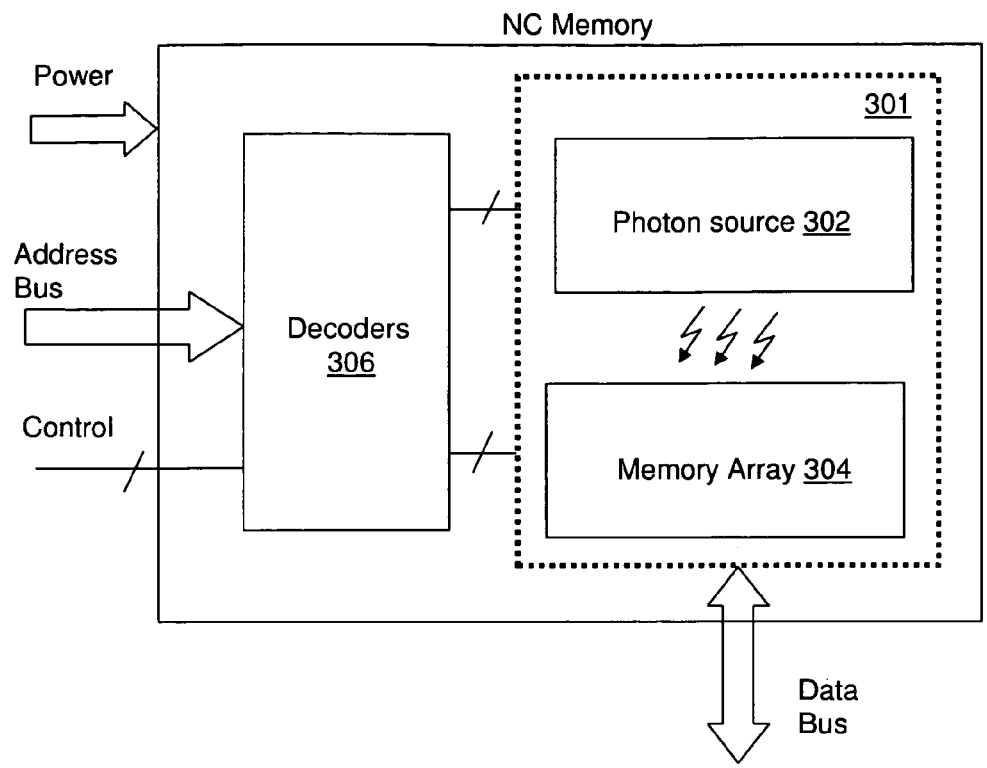
FIG. 3 depicts an illustrative embodiment of a NC memory employing the memory technology described in the present disclosure.

FIG. 3 depicts an illustrative embodiment of a NC memory 300 employing in part the memory technology described in the present disclosure. The NC memory 300 can comprise a photon source 302 such as a common one or more solid state lasers and/or light emitting diodes for inducing optical pulses such as shown in FIG. 1 that generate confined electron-hole pairs (excitons) in memory cells of a memory array 304 excitable by said pulses. The photon source 302 and the memory array 304 can be integrated in the same substrate as depicted by reference 301. The memory array 304 can be structured as a NOR or NAND memory array for mass storage of digital information. The memory array 304 can be coupled to one or more decoders 306 for electrically performing read operations as directed by address lines and control lines supplied by, for example, a central processing unit such as a microprocessor and/or DSP. The decoders can also operate to cause write operations by controlling the operation of the photon source 302 and memory array 304 according to the techniques described earlier.

In one embodiment, each of the memory cells of the memory array 304 can comprise, for example, an n-type doped silicon substrate, a tunnel oxide layer formed on the n-type doped silicon substrate, a floating nanocrystal gate embedded in a control oxide layer and formed on the tunnel oxide layer, a drain region formed by implantation of a p-type dopant material in the n-type silicon substrate, a source region formed by implantation of a p-type dopant material in the n-type silicon substrate, a photon source 302 coupled to the floating nanocrystal gate, and a control gate formed on the control oxide layer. A first memory state of the memory cell can be produced by applying photons generated by the photon source 302 to the floating nanocrystal gate to induce electron-hole pairs, and applying one or more bias voltages to at least one among the control gate, the drain region and the source region to induce a removal of electrons from the floating nanocrystal gate. A second memory state can be produced by applying one or more bias voltages of opposing polarity to the one or more bias voltages that produced the first memory state.

An accumulation of holes in the memory cells can represent a first digital value, while a deficiency of holes in the memory cells can represent a second digital value. The NC memory 300 can operate from a power source shown in FIG. 3 and can utilize common power management technology (not shown) for powering the various portions of the NC memory 300. The memory cells of the memory array 304 as just described can operate as a non-volatile memory cells which can retain a memory state when power is removed for extended periods of time. Other memory cell structures to which the above techniques can be applied are contemplated by the present disclosure.

The NC memory 300 can be an integrated circuit (IC) coupled to other NC memory ICs on a common printed circuit board (PCB) to form memories of various dimensions. For example, suppose a single NC memory 300 IC represents X Mbytes with an 8 bit data bus. To increase the data bus size, four NC memories 300 ICs can be placed on a PCB to form an X Mbyte by 32 bit data bus memory. Multiple PCBs such as this can be used to increase data bus size to 64 bits or more, or to increase memory capacity by multiples of X Mbytes.

Figure 4:
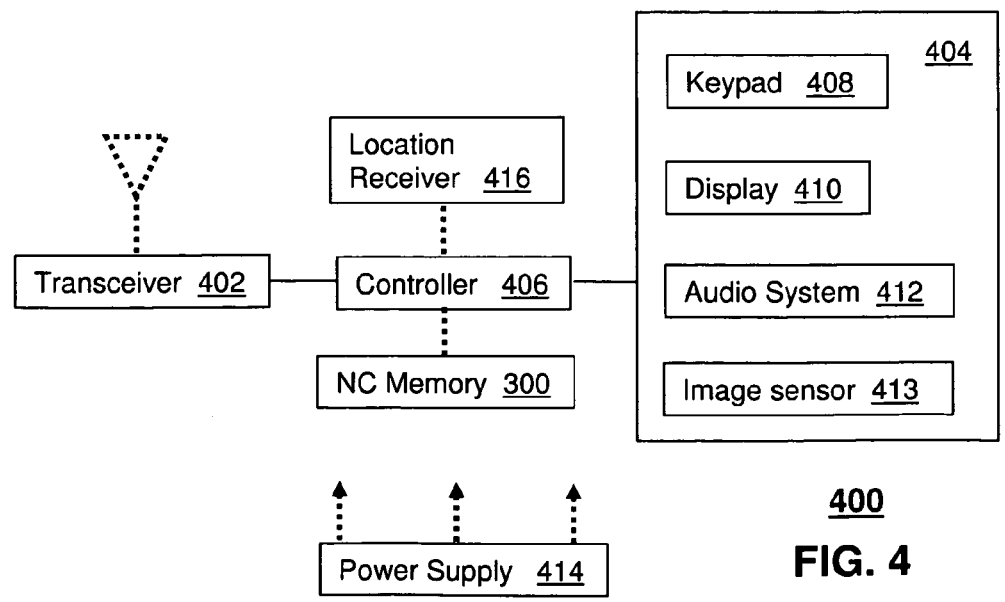
FIG. 4 depicts an illustrative embodiment of a computing device employing the NC memory of FIG. 3.
Figure 5A:
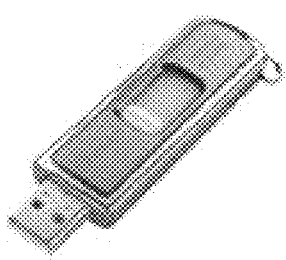
FIGS. 5A-5E depict illustrative embodiments of an apparatus employing in whole or in part the computing device of FIG. 4; and TABLE 1 depicts an illustrative comparison between the characteristic times of the optical programming ($\tau_O$) and voltage-induced programming ($\tau_V$) in $S_i/HfO_2$ NC's. $V_G$ represents the voltage for which the given $E_F$ is produced across the NC. Positive (negative) quantities represent the electrons (holes) programming. $\tau_V$ data were taken from a previous work using devices with exactly the same NC characteristics of the one investigated in this work [5].
Figure 5B:
Figure 5C:
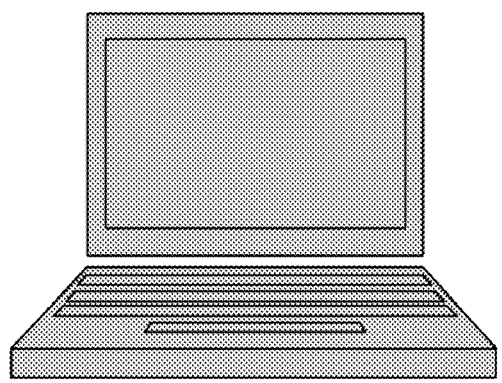
Figure 5D:
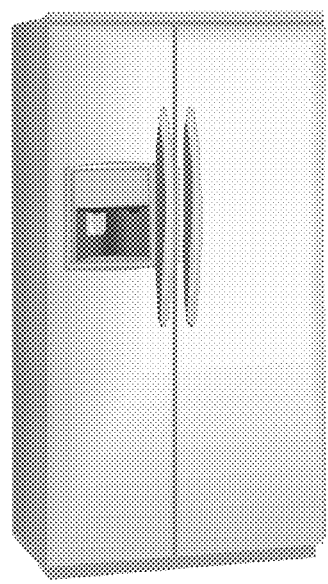
Figure 5E:
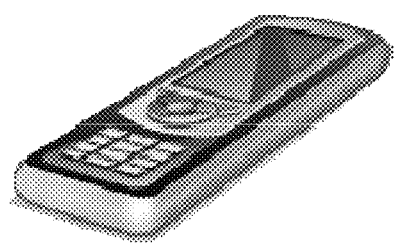

Memory configurations such as this can be used in any number of computing devices such as the computing device 400 of FIG. 4. The computing device 400 can comprise a wireline and/or wireless transceiver 402 (herein transceiver 402), a user interface (UI) 404, a power supply 414, a location receiver 416, a NC memory 300, and a controller 406 for managing operations thereof. The transceiver 402 can support short-range or long-range wireless access technologies such as Bluetooth, WiFi, Digital Enhanced Cordless Telecommunications (DECT), or cellular communication technologies, just to mention a few. Cellular technologies can include, for example, CDMA-1X, UMTS/HSDPA, GSM/GPRS, TDMA/EDGE, EV/DO, WiMAX, SDR, and next generation cellular wireless communication technologies as they arise. The transceiver 402 can also be adapted to support circuit-switched wireline access technologies (such as PSTN), packet-switched wireline access technologies (such as TCPIP, VoIP, etc.), and combinations thereof.

The UI 404 can include a depressible or touch-sensitive keypad 408 with a navigation mechanism such as a roller ball, joystick, mouse, or navigation disk for manipulating operations of the computing device 400. The keypad 408 can be an integral part of a housing assembly of the computing device 400 or an independent device operably coupled thereto by a tethered wireline interface (such as a USB cable) or a wireless interface supporting for example Bluetooth. The keypad 408 can represent a numeric dialing keypad commonly used by phones, and/or a Qwerty keypad with alphanumeric keys. The UI 404 can further include a display 410 such as monochrome or color LCD (Liquid Crystal Display), OLED (Organic Light Emitting Diode) or other suitable display technology for conveying images to an end user of the computing device 400. In an embodiment where the display 410 is touch-sensitive, a portion or all of the keypad 408 can be presented by way of the display.

The UI 404 can also include an audio system 412 that utilizes common audio technology for conveying low volume audio (such as audio heard only in the proximity of a human ear) and high volume audio (such as speakerphone for hands free operation). The audio system 412 can further include a microphone for receiving audible signals of an end user. The audio system 412 can also be used for voice recognition applications. The UI 404 can further include an image sensor 413 such as a charged coupled device (CCD) camera for capturing still or moving images.

The power supply 414 can utilize common power management technologies such as replaceable and rechargeable batteries, supply regulation technologies, and charging system technologies for supplying energy to the components of the computing device 400 to facilitate long-range or short-range portable applications. The location receiver 416 can utilize common location technology such as a global positioning system (GPS) receiver for identifying a location of the computing device 400 based on signals generated by a constellation of GPS satellites, thereby facilitating common location services such as navigation.

The controller 406 can utilize computing technologies such as a microprocessor, a digital signal processor (DSP), graphics processing unit (GPU), and/or a video processor coupled to one or more NC memories 300 applying the techniques described in the present disclosure.

FIGS. 5A-5E depict illustrative embodiments of an apparatus employing in whole or in part the computing device 400 of FIG. 4. For example, the computing device 400 can represent a portable memory such as in FIG. 5A including the NC memory 300 and other portions of the computing device 400 for communicating over a common USB bus to other devices such as computers. An automobile can also make use of the computing device 400 of FIG. 4 such as for telemetry, engine control, stereo system controls, and so on. A computer such as in FIG. 5C can utilize portions of the computing device 400. The hard drive of a common computer can for example be replaced with a number of NC memories 300 as described above, thereby eliminating moving parts of a common hard drive, and improving memory retention and reliability of the computer. An appliance such as a refrigerator shown in FIG.

5D can also use portions of the computing device 400 to control the operation of the appliance. Other common appliances not shown (e.g., microwave, cook top range, set-top box, televisions, stereo systems, etc.) can utilize portions of the computing device 400. Portable and landline communication devices such as cellular phones, cordless phones, and wireline phones, can also utilize portions of the computing device 400.

From the foregoing descriptions, it would be evident to an artisan with ordinary skill in the art that the aforementioned embodiments can be modified, reduced, or enhanced without departing from the scope and spirit of the claims described below. Accordingly, the reader is directed to the claims for a fuller understanding of the breadth and scope of the present disclosure.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

References

[1] F. Rana, S. Tiwari, and J. J. Welser, Superlattices Microstruct. 23, 757 (1998).
[2] J. S. de Sousa, A. V. Thean, J.-P. Leburton, and V. N. Freire, J. Appl. Phys. 92, 6182 (2002).
[3] J. S. de Sousa, J.-P. Leburton, A. V. Thean, V. N. Freire, and E. F. da Silva, Jr., Appl. Phys. Lett. 82, 2685 (2003).
[4] V. N. Freire and J. S. de Sousa, Proc. SPIE 5732, 547 (2005).
[5] J. S. de Sousa, V. N. Freire, and J.-P. Leburton, Appl. Phys. Lett. 90, 223504 (2007).
[6] F. A. Reboredo, A. Franceschetti, and A. Zunger, Phys. Rev. B 61, 13073 (2000).
[7] N. A. Hill and K. B. Whaley, Phys. Rev. Lett. 75, 1130 (1995).
[8] C. Delerue, G. Allan, C. Reynaud, O. Guillois, G. Ledoux, and F. Huisken, Phys. Rev. B 73, 235318 (2006).
[9] R. J. Walters, P. G. Kik, J. D. Casperson, H. A. Atwater, R. Lindstedt, M. Giorgi, and G. Bourianoff, Appl. Phys. Lett. 85, 2622 (2004).
[10] A. J. Bennett, P. Atkinson, P. See, M. B. Ward, R. M. Stevenson, Z. L. Yuan, D. C. Unitt, D. J. P. Ellis, K. Cooper, D. A. Ritchie, and A. J. Shields, Phys. Status Solidi B 243, 3730 (2006).
[11] S. Kako, C. Santori, K. Hoshino, S. Gotzinger, Y. Yamamoto, and Y. Arakawa, Nat. Mater. 5, 887 (2006).
[12] S. Strauf, P. Michler, M. Klude, D. Hommel, G. Bacher, and A. Forchel, Phys. Rev. Lett. 89, 177403 (2002).

TABLE 1

| $E_F$ (kV/cm) | $V_G$ (V) | $\tau_O$ (µs) | $\tau_V$ (µs) |
| --- | --- | --- | --- |
| −1600 | −3.00 | $2.4 \times 10^{-7}$ | 8.87 |
| −500 | −1.65 | 0.023 | 20.0 |
| −400 | −1.45 | 0.029 | 30.0 |
| −100 | −1.05 | 0.776 | 10.0 |
| +100 | +1.05 | 1680 | 39.4 |
| +400 | +1.45 | 136.7 | 0.40 |
| +500 | +1.65 | 106.7 | 0.19 |
| +1600 | +3.00 | 0.576 | 0.07 |

What is claimed is:

1. A memory device, comprising a memory cell configured to selectively store holes by applying a combination of photon stimulation and bias voltage stimulation, wherein the selective storage of holes is a representation of binary values, wherein an accumulation of holes in the memory cell represents a first binary value, and wherein a deficiency of holes in the memory cell represents a second binary value.

2. The memory device of claim 1, wherein the memory cell comprises a p-channel transistor with at least one floating nanocrystal gate coupled to a photon source.

3. The memory device of claim 1, wherein the memory cell comprises:
   an n-type substrate;
   a tunnel oxide layer formed on the n-type substrate;
   a floating nanocrystal gate embedded in a control oxide layer formed on the tunnel oxide layer coupled to a photon source; and
   a control gate formed on the control oxide layer.

4. The memory device of claim 1, wherein the photon stimulation and the bias voltage stimulation is synchronized to selectively store holes in the memory cell.

5. A memory device, comprising an array of memory cells, each memory cell is configured to selectively stores holes by applying a combination of photon stimulation and bias voltage stimulation, wherein the selective storage of holes is a representation of logical values which are binary,
   wherein an accumulation of holes in each memory cell represents a first binary value, and wherein a deficiency of holes in each memory cell represents a second binary value.

6. The memory device of claim 5, wherein the memory device is a random access memory device.

7. The memory device of claim 5, wherein the array comprises one among a NOR memory array and a NAND memory array.

8. The memory device of claim 5, wherein the array comprises at least one decoder to perform read and write cycles.

9. The memory device of claim 5, wherein each memory cell comprises a p-channel transistor with at least one floating nanocrystal gate coupled to a photon source.

10. The memory device of claim 5, wherein each memory cell comprises:
    an n-type substrate;
    a tunnel oxide layer formed on the n-type substrate;
    a floating nanocrystal gate embedded in a control oxide layer formed on the tunnel oxide layer coupled to a photon source; and
    a control gate formed on the control oxide layer.

11. The memory device of claim 5, wherein the memory device is a non-volatile memory device.

12. The memory device of claim 5, wherein the memory device comprises a mass storage medium utilized by a computer.

13. The memory device of claim 5, wherein the photon stimulation and the bias voltage stimulation is synchronized to selectively store holes in each memory cell.

14. An apparatus, comprising:
    a memory array configured to selectively store holes by applying a combination of photon stimulation and bias voltage stimulation to memory cells of the memory array, wherein an accumulation of holes in a memory cell of the memory array represents a first binary value, and wherein a deficiency of holes in the memory cell of the memory array represents a second binary value; and
    a computing device coupled to the memory array.

15. The apparatus of claim 14, wherein the apparatus comprises one among a computer, an automobile, a portable memory device, a telephony device, an appliance, a set-top box, and a television set, and wherein the computing device comprises one among a microprocessor, and a digital signal processor.

16. The apparatus of claim 14, wherein the photon stimulation and the bias voltage stimulation is synchronized to selectively store holes in the memory cells of the memory array.

* * * * *